United States Patent
Rätz

(10) Patent No.: US 9,366,717 B2
(45) Date of Patent: Jun. 14, 2016

(54) DEVICE AND PROCEDURE FOR THE DETECTION OF A SHORT CIRCUIT OR OVERCURRENT SITUATION IN A POWER SEMICONDUCTOR SWITCH

(71) Applicant: CT-Concept Technologie GmbH, Bienne (CH)

(72) Inventor: Markus Rätz, Leuzigen (CH)

(73) Assignee: CT-Concept Technologie GmbH, Biel-Bienne (CH)

(*) Notice: Subject to any disclaimer, the term of this patent is extended or adjusted under 35 U.S.C. 154(b) by 41 days.

(21) Appl. No.: 14/542,240

(22) Filed: Nov. 14, 2014

(65) Prior Publication Data

US 2015/0168484 A1    Jun. 18, 2015

(30) Foreign Application Priority Data

Dec. 13, 2013   (EP) ..................................... 13197267

(51) Int. Cl.
| | |
|---|---|
| *H03K 3/00* | (2006.01) |
| *G01R 31/26* | (2014.01) |
| *H03K 17/082* | (2006.01) |
| *H03K 17/16* | (2006.01) |

(52) U.S. Cl.
CPC ........ *G01R 31/2608* (2013.01); *H03K 17/0826* (2013.01); *H03K 17/0828* (2013.01); *H03K 17/16* (2013.01); *H03K 2217/0027* (2013.01)

(58) Field of Classification Search
CPC .................................................. G01R 31/2608
See application file for complete search history.

(56) References Cited

U.S. PATENT DOCUMENTS

2003/0206387 A1* 11/2003 Newman, Jr. ........ H05B 39/048
361/93.1

\* cited by examiner

*Primary Examiner* — Daniel Puentes
(74) *Attorney, Agent, or Firm* — Blakely Sokoloff Taylor & Zafman LLP

(57) ABSTRACT

A device for detecting a change in voltage across a switch includes a resistive-capacitive network and a timer circuit. The resistive-capacitive network includes an impedance, a first resistive element, and a first capacitive element to provide a signal representative of a voltage across the switch. The timer circuit generates a detection signal that is representative of the change in the voltage across the switch after switching on of the switch. The timer circuit raises a level of the detection signal if the voltage across the switch does not fall below a predetermined value after switching on of the switch. The resistive-capacitive network is configured such that parasitic capacitances of the device are compensated or over compensated so as to prevent the timer circuit from raising the level of the detection signal if the voltage across the switch does fall below the predetermined value after switching on of the switch.

29 Claims, 8 Drawing Sheets

DEVICE AND PROCEDURE FOR THE DETECTION OF A SHORT CIRCUIT OR OVERCURRENT SITUATION IN A POWER SEMICONDUCTOR SWITCH

CROSS-REFERENCE TO RELATED APPLICATION

This application claims priority to European Patent (EP) Application No. 13197267.1, filed Dec. 13, 2013. EP Application No. 13197267.1 is hereby incorporated by reference.

TECHNICAL FIELD

Embodiments of the present disclosure relate to a device for the detection of a change in the voltage across a power semiconductor switch. Such devices are used, for instance, for the detection of a short circuit or overcurrent situation in an IGBT ("Insulated Gate Bipolar Transistor").

BACKGROUND

High voltages can be applied and high currents can be conducted in some power semiconductor switches. Short circuits or overcurrents can quickly lead to thermal destruction of the power semiconductor switches. Power semiconductor switches can include protective circuits for the detection of short circuits and overcurrent situations. One way of detecting these situations is by indirectly monitoring the current through the power semiconductor switch by determining the voltage across the power semiconductor switch. The voltage across the power semiconductor switch should fall swiftly from a relatively high level in the switched-off condition (the "switched-off-condition" or "OFF-condition" is a condition of the power semiconductor switch in which it is "open" and does not conduct current), to a relatively low level in the switched-on condition (the "switched-on-condition" or "ON-condition" is a condition of the power semiconductor switch in which it is "closed" and may conduct current). Accordingly, a control signal of a power semiconductor switch (for example a gate-driving signal) has an ON-condition, in which it keeps the power semiconductor switch closed and an OFF-condition, in which it keeps the power semiconductor switch open.

The curve on the lower left in FIG. 1B shows an exemplary change in the collector-emitter voltage of an IGBT (an IGBT is an exemplary power semiconductor switch) after a transition from a switched-off condition to a switched-on condition (the change in a corresponding exemplary control signal 130 is shown above left) in normal operation. As shown, the collector-emitter voltage drops sharply to a very low value (close to 0 volts, for example between 0 and 10 V). An exemplary short circuit behavior of an IGBT is shown below right in FIG. 1B. In contrast to normal operation, the collector-emitter voltage does not fall to the very low value, but high currents can flow in the IGBT (for example between three and ten times the nominal current of the IGBT). In other short circuit cases, the collector-emitter voltage first drops to its value under normal operation but rises again after some time. This may result in a high thermal loading of the power semiconductor switch which can be damaged in a relatively short time. Some IGBTs for example, can withstand a short circuit for some time (e.g., 10 µs) in the switched-on condition without damage. Protective circuits for the detection of a short circuit or overcurrent situation should turn off the power semiconductor switch before the end of this time period. Similar characteristics can also be found in other power semiconductor switches other than in IGBTs. An overcurrent state may as a short circuit state lead to an increased collector-emitter voltage. The collector-emitter voltage in an overcurrent state may be closer to the collector-emitter voltage in the normal state than in the short-circuit state.

An overcurrent or short-circuit state can also occur a period of time after the power switch has been turned on. In this error case, the collector-emitter voltage can drop to a low value associated with normal operation before an error occurs (e.g., leading to a short-circuit). This can result in a sharp increase in the collector-emitter-voltage (not shown in FIG. 1B), and can also have the negative effects on the power semiconductor switch described above.

BRIEF DESCRIPTION OF THE FIGURES

Non-limiting and non-exhaustive embodiments of the invention have been described with reference to the following figures, whereby, if not otherwise specified, the same reference symbols relate to the same components in different figures.

DETAILED DESCRIPTION

To enable an in-depth understanding of the present invention, several details will be shown in the following description. However, it is clear to the specialist that these specific details are not necessary to implement the present invention. Elsewhere, for ease of comprehension, known devices and processes have not been described in detail.

In the present description, a reference to "a version", "an arrangement", "an example" or "example" means that a particular feature, a structure or a property that is described in connection with this version, is included in at least one version of the present invention. Thus, the phrases "in a version", "in the form", "an example" or "example" at different places in this description do not necessarily refer to the same version or same example. Furthermore, the particular features, structures or properties can be combined in desired and suitable combinations and/or sub-combinations in one or more models or examples. Special features, structures or properties can be included in an integrated circuit, in an electronic circuit, in a circuit logic or in other suitable components which provide the described functionality. Over and above this, it should be noted that the drawings serve as guidance for the specialist and that these are not necessarily drawn to scale.

Figure 1A:
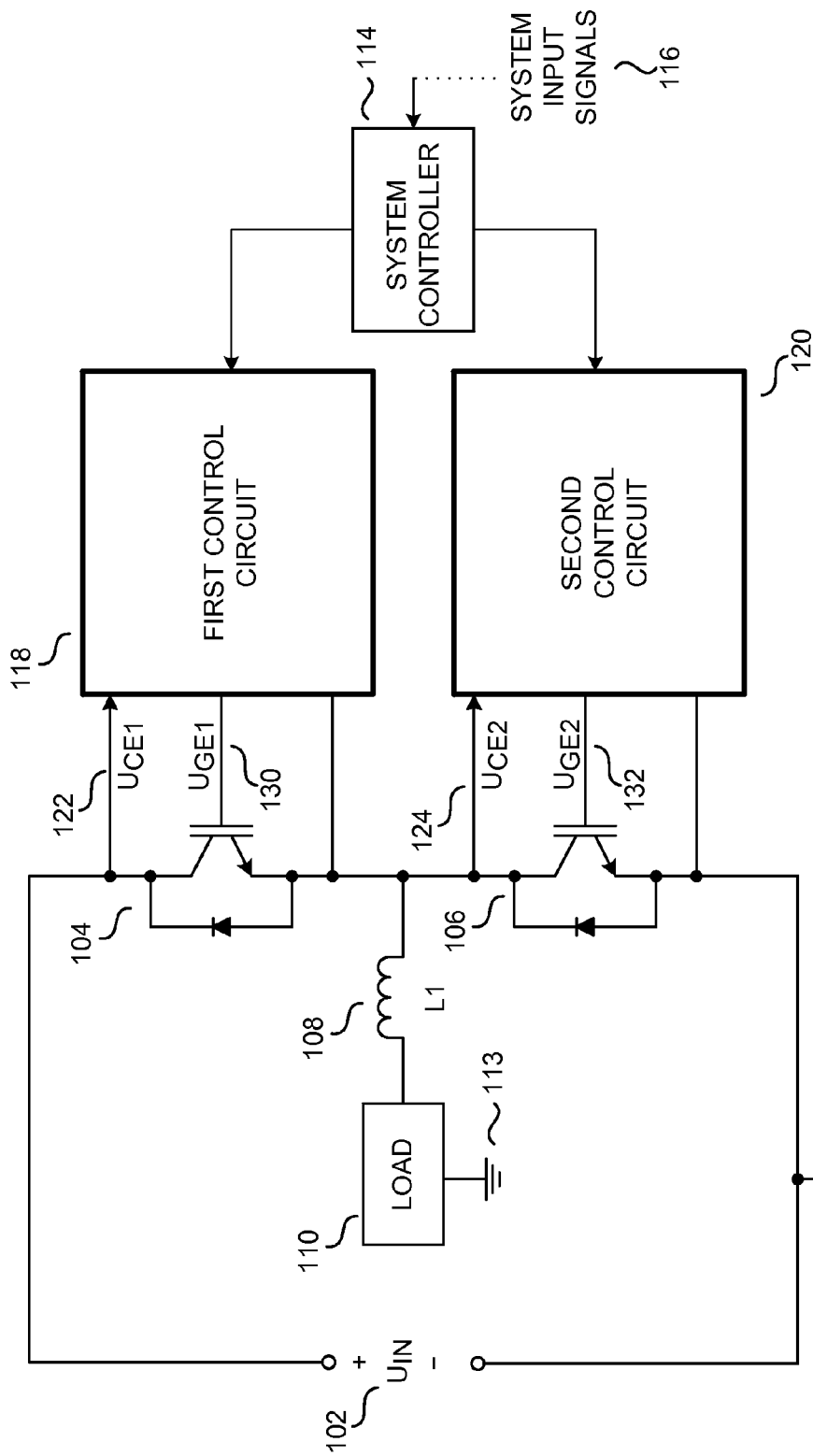
FIG. 1A shows an example device for providing electrical energy.
Figure 1B:
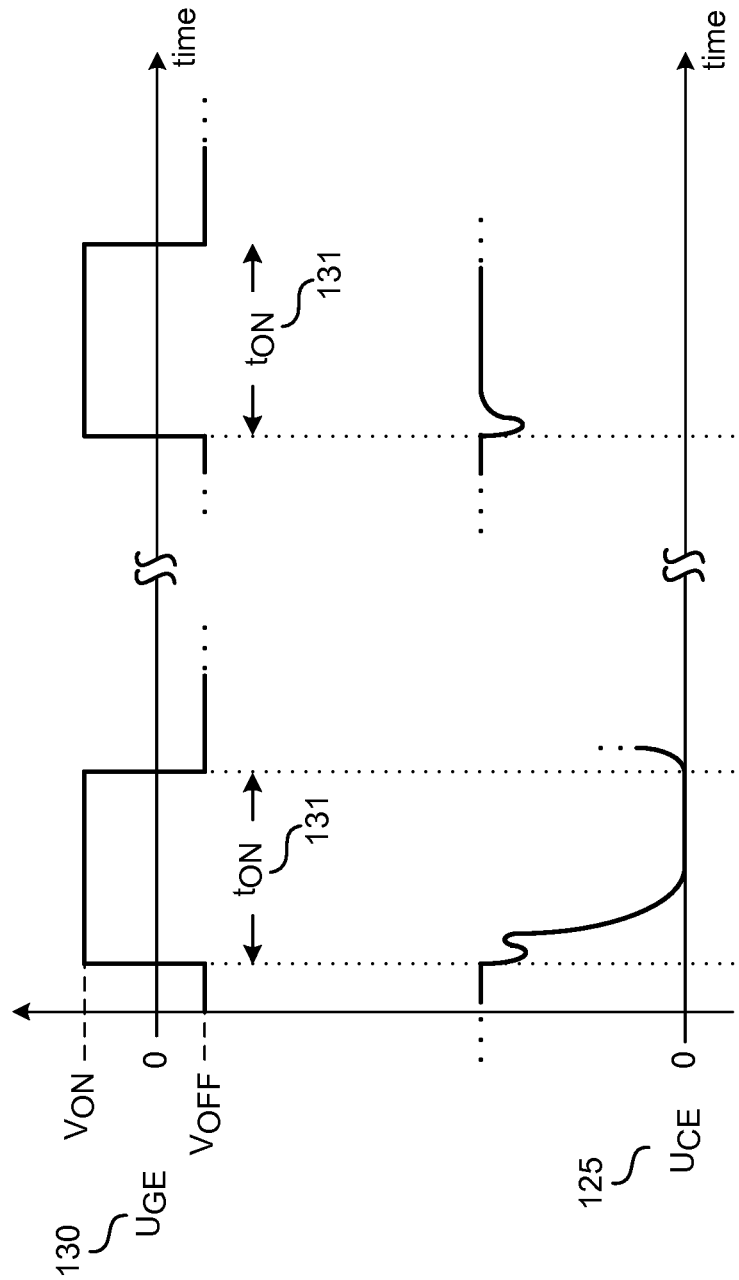
FIG. 1B shows a variety of signals of the device from FIG. 1A in a normal situation and in an example short circuit and/or overcurrent situation.

As shown in FIG. 1B and described previously, during normal operation, the collector-emitter voltage 125 ($U_{CE}$) of a power semiconductor switch falls swiftly from a relatively high level to a low level after turning on of the power semiconductor switch. In particular short circuit or overcurrent situations, however, the collector-emitter-voltage 125 ($U_{CE}$) may not fall to the low level and remains at a higher level. This characteristic can be utilized by protective circuits for determining the possible existence of a short circuit or overcurrent situation in response to the change in the collector-emitter voltage and, if necessary, turn off of the power semiconductor switch. That is, the differences described in the change of the collector-emitter voltage between normal operation and short circuit and/or overcurrent situation can be taken advantage of for detecting a short circuit or overcurrent situation. As already described, parasitic capacitances can trigger an erroneous detection of a short circuit or overcurrent situation in devices designed for the detection of a change in collector-emitter voltage of a power semiconductor switch, by influencing detection signals of a protective circuit even after the collector-emitter voltage 125 ($U_{CE}$) drops to a low level under normal conditions.

For example, in some state-of-the-art circuits, multiple resistances are coupled in series for the purpose of reducing the value of the sensed collector-emitter voltage 125 ($U_{CE}$) of the power semiconductor switch, which can amount to a few kilovolts. To limit the losses in this circuit and also for circuit design reasons, it is desirable in some circuits to limit the current, with the help of these resistances, to 1 mA or lower. Therefore, resistances with values in the mega-ohm range may be used. Since the values of parasitic capacitances may be in the pico-farad range and these capacitances are discharged over the resistances in the mega-ohm range, the resultant time constant may be a few microseconds for the parasitic capacitances to discharge. These time constants may also be in the range of a desirable short-circuit switch-off time (as mentioned above, the desirable short-circuit switch-off time may correspond to the period of time which the power semiconductor switch may withstand short circuit conditions without damage), which may be in the order of 10 µs for some power semiconductor switches, and may influence short-circuit or overcurrent detection.

In one example of detecting a short circuit or overcurrent situation, a signal representative of the change in the collector-emitter voltage is compared to a reference voltage (which can be fixed or variable). If the signal representative of the change in the collector-emitter voltage is greater than the reference voltage, a fault is detected. The parasitic capacitances may cause the signal representative of the change in the collector-emitter voltage to exceed the reference voltage (due to the time constants) even though there is no short circuit or overcurrent situation. Hence the discharging of the parasitic capacitances can interfere with the detection of a short circuit or overcurrent situation.

For example, a capacitance may be included in the protective circuit that is designed to be charged if a level of the collector-emitter voltage 125 ($U_{CE}$) of the power semiconductor switch lies over a predetermined value after the switching-on procedure. This capacitance may be further charged by the parasitic capacitances, although the collector-emitter voltage 125 ($U_{CE}$) of the power semiconductor switch has already fallen under the predetermined value. This can result in the protective circuit erroneously determining the existence of a high collector-emitter voltage 125 ($U_{CE}$) and detecting a short circuit or overcurrent condition. These effects are particularly serious for high collector-emitter voltage 125 ($U_{CE}$) in the region of several kilovolts (for example between 2.2 and 4.5 kV in the case of some IGBTs) and for elements with relatively slow switching behavior.

In the devices discussed here, a timer circuit is used in combination with a resistive-capacitive network, which compensates or over-compensates the parasitic capacitances. As such the influence of the parasitic capacitances on the detection of a short circuit or overcurrent situation is reduced or avoided. As a further result of this, erroneous detections of short circuits or overcurrent situations are avoided. It should be appreciated that the term "compensated" includes a certain degree of under-compensation of the parasitic capacitances, as long as the value of a detection signal remains below the predetermined threshold voltage if the signal representative of the voltage across the power semiconductor switch falls below a predetermined level after turning on the power semiconductor switch (e.g., in a normal operation mode). In one example, it can be possible to undercompensate the parasitic capacitances as long as a dynamic voltage level at the third node falls at least to the value of the predetermined threshold voltage. If the timer circuit includes a capacitance, it is possible to undercompensate the parasitic capacitances even further. In this example, the allowed amount of under-compensation is determined by a charge of the capacitance of the timer circuit. In other examples the parasitic capacitances may be undercompensated by up to substantially 5% (i.e., a value of the capacitances of the resistive-capacitive network between the first and second nodes is up to substantially 5% higher than required to compensate for the parasitic capacitances or a value of the first capacitive element is up to substantially 5% lower than required to compensate for the parasitic capacitances).

FIG. 1A shows a device 100 (also called a power converter) for providing electrical energy to a load 110. The flow of energy can also be directed in the opposite direction. In this example, element 110 is an energy source. Element 110 can also act as energy source and/or as load in different operation modes. Subsequently the device 100 is referred to as a device for providing energy (the energy can be provided at different output terminals). The device 100 includes two power semiconductor switches 104, 106, which are coupled in series between the input 102 and the input return 112. Further, device 100 is coupled to receive an input DC voltage 102 (UN). The device is designed to transfer electrical energy from an input to an output by controlling the power semiconductors 104, 106. The load 110 is further coupled to the output. Thus, the device for the supply of electrical energy can control the voltage, current or a combination of the two supplied to the load 110. In the example shown in FIG. 1A, the power semiconductor switches 104, 106 are IGBTs.

Hereafter, the devices and processes will be explained using the example of IGBTs. However, the devices for the detection of a change in the voltage across a power semiconductor switch, the control circuits and the devices for supply of electrical energy are not limited to use with IGBTs. In fact, they can also be used in combination with other power semiconductor switches. For example, metal-oxide-semiconductor field effect transistors (MOSFETs), bipolar transistors, IEGTs ("injection enhancement gate transistors") and GTOs ("gate turn-off thyristors") can be used with devices for the detection of a change in the voltage across a power semiconductor switch, control circuits and devices for the supply of electrical energy. Further devices which are based on gallium nitride (GaN) semiconductors or silicon carbide (SiC) semiconductors may also be used for the detection of a change in the voltage across a power semiconductor switch, control circuits and the devices for supply of electrical.

A maximum nominal collector-emitter, anode-cathode or drain-source voltage of a power semiconductor switch in a switched-off state can be more than 500 V, preferably more than 2 kV.

Moreover, the devices for the detection of a change in the voltage across a power semiconductor switch, control circuits and devices for supply of electrical energy, are not limited to use with power semiconductor switches. Thus, other semiconductor switches can also be used along with the devices for the detection of a change in the voltage across a power semiconductor switch, control circuits and devices for supply of electrical energy. The effects and advantages discussed here occur, at least partly, also in systems with other semiconductor switches.

Since IGBTs will be discussed hereafter, the terminals of the power semiconductor switches may be referred to as "collector", "gate" and "emitter". As explained earlier, the devices and processes are however not limited to IGBTs. To keep it short, the term "emitter" may also include the terminal of the corresponding power semiconductor switch referred to as the "source" or "cathode". Likewise, the term "collector" may also include the terminal of the corresponding power semiconductor switch referred to as the "drain" or "anode", and the term "gate" may also include the terminal referred to as the "base". As a result, the term "collector-emitter voltage" also includes "drain-source voltage" and a "cathode-anode-voltage", the term "collector voltage" and "emitter voltage" also includes "drain voltage" or "anode voltage" or "source voltage" or "cathode voltage".

Figure 2:
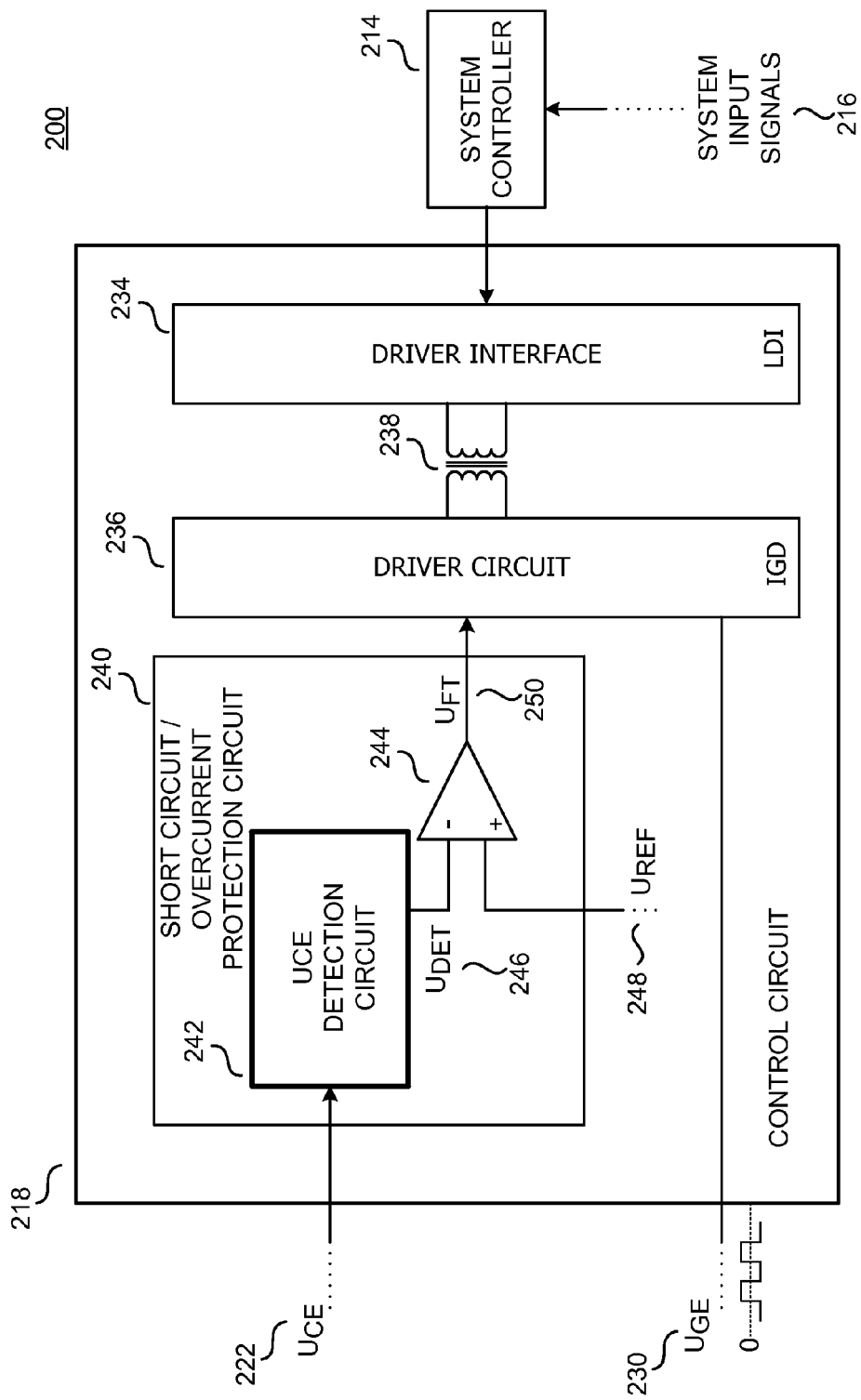
FIG. 2 represents an exemplary control circuit.

The power semiconductor switches 104,106 are each controlled by the first and second control circuits 118, 120 (an exemplary control circuit is shown in connection with FIG. 2). These provide a first and second gate-emitter driver signal 130,132 ($U_{GE1}$, $U_{GE2}$) for controlling the switching of the first and second IGBTs 104, 106. Both control circuits 118, 120 can, in turn, optionally be controlled by a system controller 114. The system controller 114 is illustrated as including an input which may be coupled to receive system-input signals 116. In the example of FIG. 1A, the two power semiconductor switches 104, 106 are shown in a half bridge configuration. The devices for the detection of a change in the voltage across a power semiconductor switch, control circuits and devices for supply of electrical energy can, however, may also be utilized in other topologies. For example, a single power semiconductor switch (e.g. a single IGBT) can be coupled with a device for the detection of a change in the voltage across a power semiconductor switch or a control circuit. In other examples, in a three phase system with six power semiconductor switches or twelve power semiconductor switches, each of the power semiconductor switches can have a device for the detection of change in the voltage across a power semiconductor switch.

In addition to outputting gate-emitter driver signal, the control circuits 118, 120 also receive signals which represent voltages of the power semiconductor switches 104, 106. The signals could be voltage signals or current signals. In the example shown in FIG. 1A, each control circuit 118, 120 receives a signal that is representative of the collector-emitter voltage and is referred to as collector-emitter voltage signal 122, 124 ($U_{CE1}$, $U_{CE2}$).

In FIG. 1A, the control circuits 104, 106 are drawn as separate control circuits. However, both control circuits 104, 106 can also be combined into a single control circuit. In the example of a single control circuit, the single control circuit controls both of the power semiconductor switches 104, 106. Further, the second gate-emitter-driver signal 132 ($U_{GE2}$) may be the inverted first gate-emitter-driver signal 130 ($U_{GE1}$).

Both control circuits 118, 120 include a device for the detection of a change in the voltage over a power semiconductor switch. With the respective collector-emitter voltage signals 122, 124 ($U_{CE1}$, $U_{CE2}$), a short circuit and/or overcurrent situation of the respective power semiconductor switch can be determined. When a short circuit and/or overcurrent situation is detected, the respective power semiconductor switch 104, 106 may be switched off.

FIG. 1B shows a variety of example signals for the device shown in FIG. 1A for providing electrical energy to a load in a normal condition and in a short circuit and/or overcurrent situation. The topmost curve in FIG. 1B shows an example control signal 130 ($U_{GE}$) of the power semiconductor switch. The voltage level of the control signal 130 switches between a voltage $V_{OFF}$ in the switched-off condition to a voltage $V_{ON}$ in the switched-on condition. The values of $V_{OFF}$ and $V_{ON}$ can be chosen as desired. In an example, the control signal 130 drives the gate of the power semiconductor switch and the values of $V_{OFF}$ and $V_{ON}$ correspond to the gate-emitter voltage of the power semiconductor switch in the switched-off or the switched-on state. For example, a value for the voltage $V_{OFF}$ for driving the IGBTs in the switched-off state can vary between −20V and 0V (preferably between −15V and −10V) and a value for the voltage $V_{ON}$ for driving the IGBTs in the switched-on state can vary between 10V and 20V (preferably between 14.5 V and 15.5 V). For power-MOSFETs, regarding the values of $V_{OFF}$ and $V_{ON}$, the voltage of the gate-source voltage can correspond respectively to the voltage of the power-MOSFET in the switched-off or the switched-on condition. For example, a value for the voltage $V_{OFF}$ for power-MOSFET can be between −15V and 0V and a value for the voltage $V_{ON}$ for MOSFETs between 10V and 20V.

FIG. 2 shows an example control circuit 218 (which is one example of the control circuits 118, 120 from FIG. 1A). The control circuit 218 includes: A device for the detection of a change in collector-emitter voltage 242 (labeled as UCE detection circuit), a comparator 244, a driver circuit 236 and an optional driver interface 234. The device for the detection of a change in the voltage across a power semiconductor switch 242 and the comparator 244 can be combined in a short circuit or overcurrent protection circuit 240. However, both components may also be included separately in the control circuit 218. In an example, the comparator 244 may be included in the driver circuit 236 and the driver circuit 236 receives the detection signal 246 ($U_{DET}$) outputted by the device for detecting a change in the voltage across a power semiconductor device 242.

The device for the detection of a change in the voltage across a power semiconductor switch 242 receives a signal 222, which is representative for the collector-emitter voltage of a power semiconductor switch (for example signals 122 or 124 from FIG. 1A). In response to this signal 222, which is representative of the collector-emitter voltage of the power semiconductor switch, the device for the detection of a change in the voltage across a power semiconductor switch 242 generates the detection signal 246 ($U_{DET}$), which is representative of a change in the voltage across a power semiconductor switch after switching on the power semiconductor switch.

The short-circuit or overcurrent protection circuit 240 is coupled to receive a reference signal 248 ($U_{REF}$). The comparator 244 compares the reference signal 248 ($U_{REF}$) and the detection signal 246 ($U_{DET}$) and determines whether a short circuit and/or overcurrent condition exists. In one example, the short-circuit and/or overcurrent protection circuit 240 detects that the short-circuit and/or overcurrent condition exists when the detection signal 246, which is representative of the collector-emitter voltage of a power semiconductor switch after switching on the semiconductor power switch, is greater than the reference signal 248. The reference signal 248 may be an external reference signal, or may be supplied from the driver circuit 236 to the short-circuit and/or overcurrent state protection circuit 240.

As already described above, the collector-emitter voltage of the power semiconductor switch should quickly drop to a relatively low value after the power switch is turned on. A collector-emitter voltage which increases above a predetermined value may be indicative of the presence of a short-circuit and/or overcurrent state. The lower curves in FIG. 1B illustrate this. A normal switching on process is shown on the left side of FIG. 1B. The collector-emitter voltage 125 ($U_{CE}$) decreases rapidly after the switching on event. The device generates a detection signal ($U_{DET}$) from a signal which is representative of the collector-emitter voltage of 125 ($U_{CE}$) in order to detect the changes in the waveform of a collector-emitter voltage 242. The detection signal 246 ($U_{DET}$) should remain below the reference signal 248 in the circuit of FIG. 2 when the example waveform of the collector-emitter voltage 125 ($U_{CE}$) is as shown on the left in FIG. 1B. In this case, correctly, no short circuit or overcurrent is detected. As already mentioned above, the device for the detection of a voltage over a power semiconductor switch may prevent a false detection of a short circuit and/or overcurrent state, which may occur due to parasitic capacitances present in the device. This prevention of false detection of a short circuit and/or overcurrent state can be provided for different voltage levels of the collector-emitter voltage (e.g., from 200 V to 4.5 kV) or for different switching delays of different power semiconductor switches.

The short-circuit and/or overcurrent protection circuit 240 can output an error signal $U_{FT}$ 250 if a short-circuit and/or overcurrent state is detected. In the example of FIG. 2, an error signal 250 ($U_{FT}$) is output to the driver circuit 236. In response to the error signal 250, the driver circuit 236 may switch off the power semiconductor switch to prevent damage thereto. However, the error signal can also be processed in other ways in alternative arrangements. For instance, the error signal 250 ($U_{FT}$) may be provided to a further control element. This further control element can switch off two or more power semiconductor switches in a predetermined order.

As already described above, the driver circuit 236 can receive an error signal 250 that indicates a short-circuit and/or overcurrent state, and turn off the power semiconductor switch in response to a detected short-circuit and/or overcurrent state. One or more components of the short-circuit and/or overcurrent state protection circuit 240 may be optionally included in the driver circuit 236. For example, the comparator 244 may be included in the driver circuit 236 and the driver circuit may receive the reference signal 248 ($U_{REF}$) and the detection signal 246 ($U_{DET}$) which is representative of the change of the collector-emitter voltage. In another example, the reference signal 248 may be generated internally to the driver circuit and the driver circuit includes the comparator 244. As such the driver circuit receives the detection signal 246. In addition, the driver circuit 236 may also supply a gate-emitter-driver signal 230 ($U_{GE}$) to control the power semiconductor switch.

In the example of FIG. 2, the driver circuit 236 is coupled with the optional driver interface 234 via a galvanic isolation 238 (for example a transformer) in order to receive control signals from the system controller 214. The driver interface 234 may in turn be coupled to the system controller 214, which receives the system inputs 216. The driver circuit 236 may be controlled by the received system inputs 216.

Figure 3:
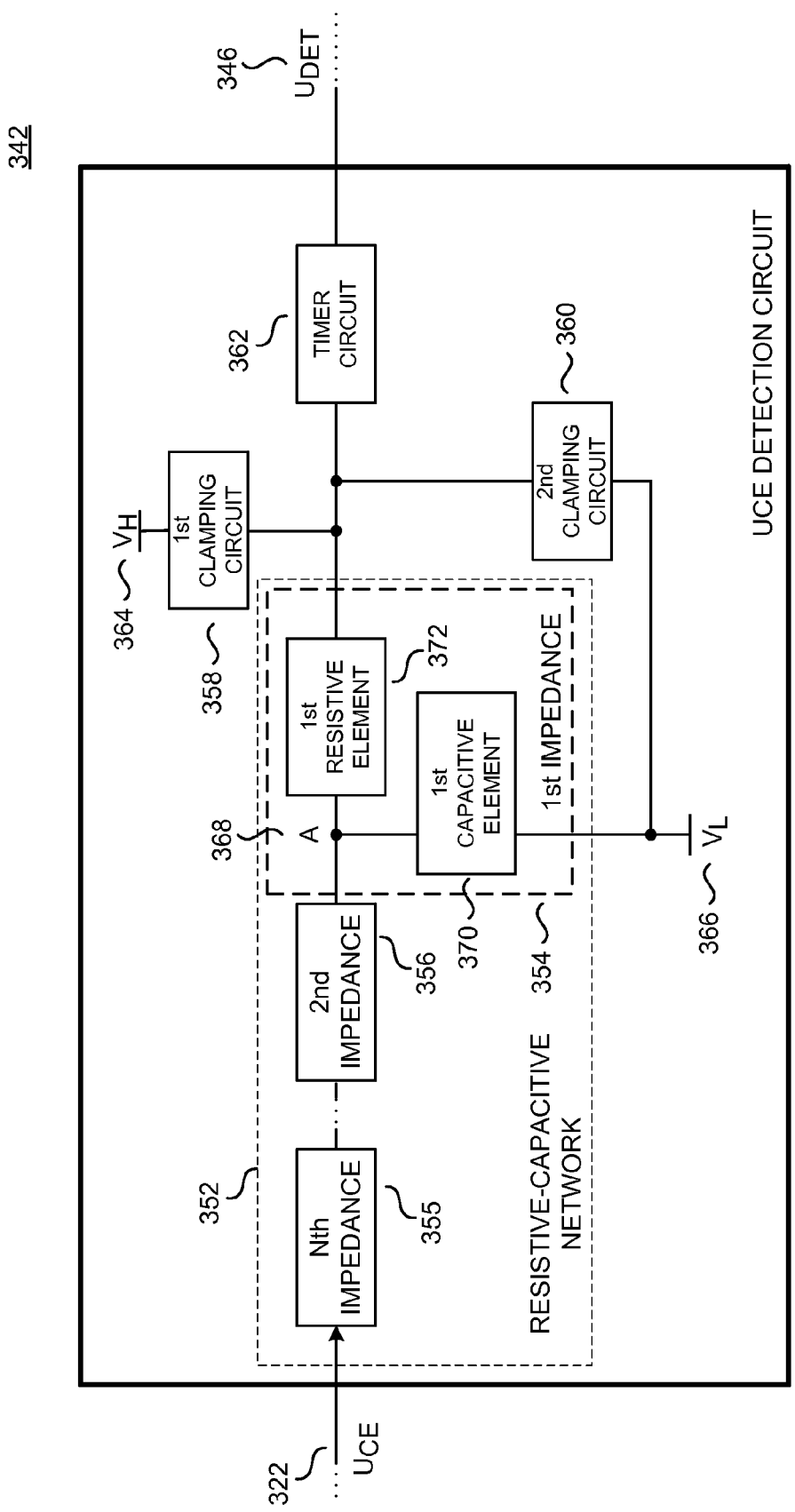
FIG. 3 shows an exemplary device for the detection of the voltage change across a power semiconductor switch.

FIG. 3 shows an example device for the detection of a change in a voltage across a power semiconductor switch 342 (which is one example of the detection circuit 242 in FIG. 2) which may be utilized in a control circuit for a power semiconductor switch. The device for the detection of a change of a voltage across a power semiconductor switch 342 includes: a resistive-capacitive network 352, a timer circuit 362 and optional first and second clamping circuits 358, 360.

An input signal 322 ($U_{CE}$), which is representative of a collector-emitter voltage of a power semiconductor switch, may be coupled at a first node of the resistive-capacitive network 352. The resistive-capacitive network 352 also provides an output signal, which is also representative of the collector-emitter voltage of a power semiconductor switch (at a lower voltage level than the input signal 322 ($U_{CE}$)) at a second node A. The timer circuit 362 is coupled 361 to the second node A through a resistive element 372 (and optionally via further elements). The timer circuit 362 is thus also coupled to a third node of the resistive-capacitive network 352. The timer circuit 362 generates a detection signal 346 ($U_{DET}$) in response to a voltage at the third node of the resistive-capacitive network 352, the detection signal 346 ($U_{DET}$) is representative of a change of the collector-emitter voltage of a power semiconductor switch after turning on the power semiconductor switch. In some examples, the timer circuit 362 includes a capacitance, which is designed to be charged to a predetermined threshold voltage in the event of the voltage at second node A 368 not falling beneath a predetermined value after turning on the power semiconductor switch. The voltage applied across the capacitor of the timer circuit 362 can thus be used as a detection signal 346 ($U_{DET}$). The timer circuit can also be implemented with other circuits. For instance, a digital circuit can be utilized as timer circuit.

The resistive-capacitive network 352 includes a first capacitive element 370 coupled between the second node A and a fourth node of the resistive-capacitive network 352. The fourth node of the resistive-capacitive network 352 is at a second reference potential 366 ($V_L$). In addition, the resistive-capacitive network 352 includes, as described above, the first resistive element 372 coupled between the second node A and the third node. One or more impedances 355, 356 are coupled between the first node receiving the input signal 322 ($U_{CE}$) and the second node A 368.

A first optional clamping circuit 358 is coupled between the third node of the resistive-capacitive network 352 and a first reference potential 364 ($V_H$). The first optional camping circuit 358 is designed to limit the voltage at the third node to the first reference potential 364 ($V_H$). The value of the first reference potential 364 ($V_H$) can be selected to be less than a level of the input signal 322 ($U_{CE}$). The first reference potential 364 ($V_H$) can also vary with time. As this level can correspond to a (possibly high) collector-emitter voltage of the power semiconductor switch, the value of the first reference potential 364 ($V_H$) can be set below a tenth or even below a hundredth of the peak level of the input signal 322 ($U_{CE}$).

In addition, the value of the first reference potential 364 ($V_H$) can be selected to be more than the level of the reference signal $U_{REF}$ 248 (see FIG. 2), when a comparator as shown in FIG. 2 is used in order to compare the detection signal 346 with a reference signal for the detection of a short-circuit or overcurrent state. In one example, the value of the control signal 130 ($U_{GE}$) in the switched on state (i.e. the value $V_{ON}$) may be utilized as the second reference potential 364 ($V_H$). This may be advantageous as this voltage may already be available in the driver circuit 236 (see FIG. 2).

As long as the input signal 322 ($U_{CE}$) has a high enough value such that the voltage level at the third node of the resistive-capacitive network is greater than the first reference potential 364 ($V_H$) (and optionally the additional a voltage drop across elements of the first clamping circuit 358, e.g. a diode), the voltage at the third node is substantially clamped to the first reference potential ($V_H$) by the first clamping circuit 358 (and a potential voltage drop over elements of the first clamping circuit, e.g. a diode). In this state, the elements of the resistive-capacitive network 352 form a resistive-capacitive voltage divider in the dynamic equivalent circuit. In the dynamic equivalent circuit, the first resistive element 372 is coupled in parallel with the first capacitive element 370 (since there is only a stationary voltage difference between the second reference potential 366 ($V_L$) and the first reference potential 364 ($V_H$), the third node and fourth node are shorted in the dynamic equivalent circuit). The first resistive element 372 and the first capacitive element 370 can thus be combined as a (virtual) first impedance 354. The dynamic portion of the input signal 322 ($U_{CE}$) drops over the one or more impedances 355, 356 and the first impedance 354. As a result, at the second node A 368, the dynamic component of the input signal 322 ($U_{CE}$) is divided according to the ratio of the one or more impedances 355, 356, and the first impedance 354.

When the input signal 322 ($U_{CE}$) has dropped to a low enough value such that the voltage level at the third node of the resistive-capacitive network is less than the first reference potential 364 ($V_H$) (and a potential a voltage drop across elements of the first clamping circuit 358, such as a diode), the first clamp circuit 358 does not clamp the voltage at the third node of the resistive-capacitive network. In this case, the elements of the resistive-capacitive network 352 again form a resistive-capacitive voltage divider in the dynamic equivalent circuit, where optional resistive elements of the timer circuit 352 are dynamically connected in series with the first resistive element 372. The additional resistive elements of the timer circuit 352 can lead to a change in the dynamic properties of the resistive-capacitive voltage divider. Nevertheless, the dynamic component of the input signal 322 ($U_{CE}$) is again divided down at the second node A 368.

In both modes described above, the resistive-capacitive voltage divider formed by the resistive-capacitive network 352 (and optional elements of the timer circuit 362) divides a dynamic component of the input signal 322 ($U_{CE}$) to a lower voltage level at the second node A.

A number of the impedances of resistive-capacitive network 352 can be freely selected. Thus, a desired value of the voltage level at node A for a predetermined voltage level of the input signal 322 ($U_{CE}$) can be adjusted by various different combinations of impedances. It is possible on the one hand, to couple a larger number of impedances of lower value in series. On the other hand, a small number, or even only two impedances can be used with the higher valued impedances. In one example, the impedances can be selected so that a current flowing in the resistive-capacitive network 352 when connected to a collector-emitter voltage ($U_{CE}$) of a power semiconductor switch does not exceed a predetermined current level (e.g., a mean current of 1.5 mA).

As described above, the resistive-capacitive network 352 compensates for the parasitic capacitances of the device for the detection of the change in the voltage across a power semiconductor switch 342, or overcompensates the parasitic capacitances. The voltage at the second node A therefore decreases as input signal 322 ($U_{CE}$) decreases to a lower value as would be the case if the parasitic capacitances of the device for the detection of the change in the collector-emitter voltage or drain-source voltage of a power semiconductor switch 342 were not compensated. The voltage at second node A, however, is lower than the voltage would be if there was no compensation of the parasitic capacitances at a predetermined time after the turn-on process has started. As such, the capacitance of the timer circuit 362 is prevented from being charged to a value greater than the predetermined threshold (which is also referred to as a reference signal which is used to detect whether a short circuit or overcurrent event occurs), if no short-circuit or overload condition exists (an example waveform of the input signal 322 ($U_{CE}$) is shown on the left hand side of FIG. 1B). If alternative timer circuits are utilized, a lower voltage level at the second node A may also further prevent the detection signal with an overly high level from being outputted and, as a result, a false detection of a short-circuit or overcurrent condition may occur. Furthermore, changes in the input signal 322 ($U_{CE}$) may be propagated without substantial delay to the second node A with the use of the resistive-capacitive network 352 (which forms an resistive-capacitive voltage divider in the dynamic equivalent circuit) that.

The second optional clamping circuit 360 is coupled to limit a voltage at the third node to a predetermined minimum voltage. The value of the predetermined minimum voltage can be selected (an can vary with time) to be less than the level of the reference signal $U_{REF}$ 248 (see FIG. 2), when a comparator is used as shown in FIG. 2, in order to compare the detection signal 346 with a reference signal for the detection of a short-circuit or overcurrent state. In one example, the value of the control signal 130 in the switched off state ($V_{OFF}$) may be used as the predetermined minimum voltage. This may be advantageous as this voltage may already be available in the driver circuit 236 (see FIG. 2). In addition, the second clamping circuit 360 can clamp the level of the third node to the second reference potential ($V_L$) 366 of the fourth node of the resistive-capacitive network 352. The second optional clamping circuit can be utilized to protect the device for detecting a change of the voltage across a power semiconductor switch 352 and the components coupled to this device (e.g., a drive circuit 236 of FIG. 2).

Figure 4:
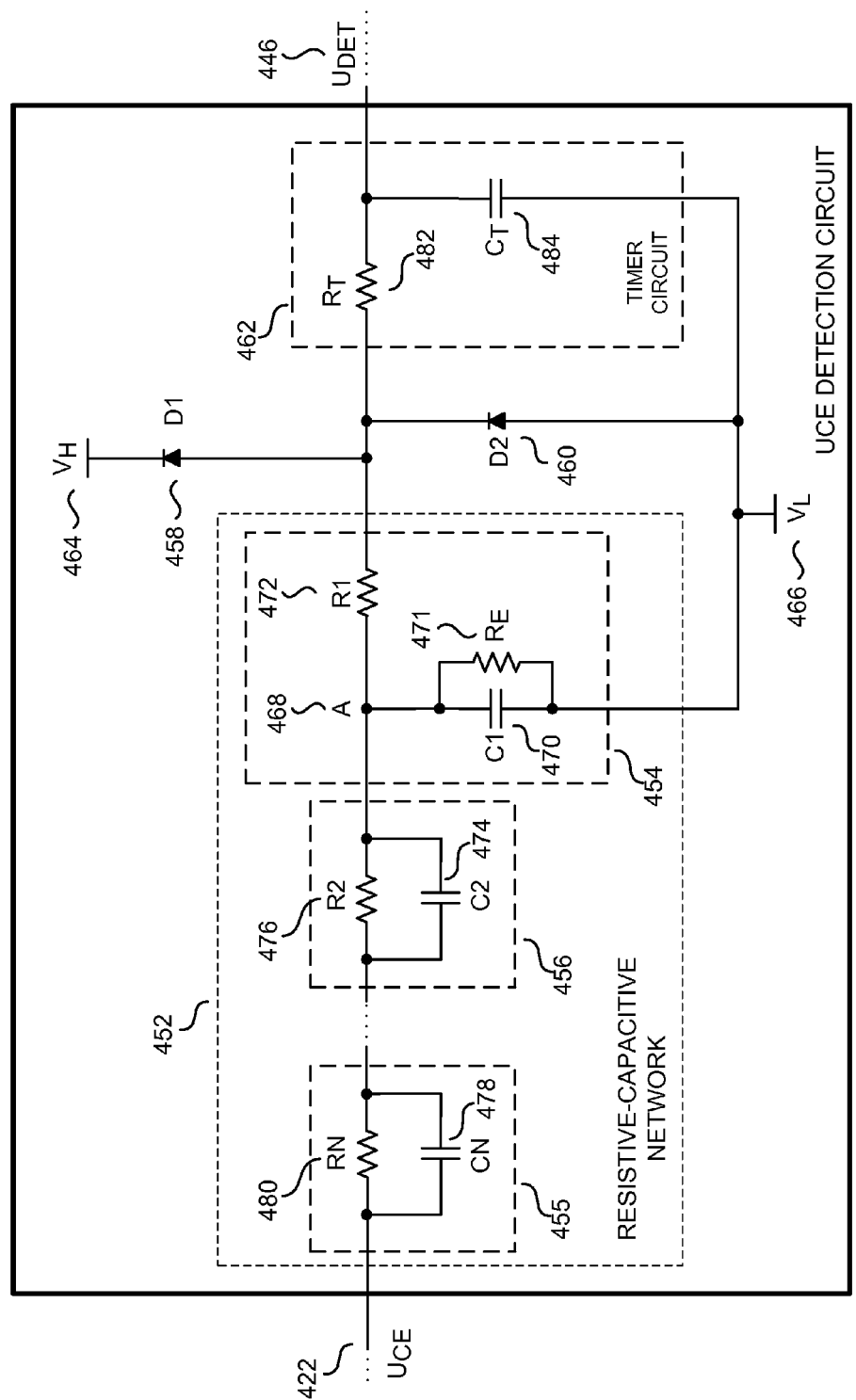
FIG. 4 shows another exemplary device for the detection of the voltage change across a power semiconductor switch.

FIG. 4 illustrates a further exemplary device for the detection of a change of a voltage over a power semiconductor switch 442. Like the device in FIG. 3, the device in FIG. 4 includes: a resistive-capacitive network 452, a timer circuit 462 and optional first and second clamping circuits 458, 460. It should be appreciated that these coupled and function as described in reference to FIG. 3.

A first capacitive element 470 of the resistive-capacitive network 452 is coupled between a second node A 468 and a fourth node. For example, the voltage at the fourth node can be substantially the predetermined minimum voltage of a second clamping circuit 460. Additionally, a first resistive element 472 ($R_1$) is coupled between the second node A 468 and the third node of the resistive-capacitive network 452. The first resistive element 472 ($R_1$) can have a value between 10 k$\Omega$ and 1 M$\Omega$. As discussed in connection with FIG. 3, the first resistive element 472 ($R_1$) and the first capacitive element 470 form, in the dynamic equivalent circuit, a first (virtual) impedance 454 of a resistive-capacitive voltage divider.

Further, the resistive-capacitive network 452 has one or several additional impedances 455, 456 that are coupled between the second node A 468 and the first node of the resistive-capacitive network 452, and coupled to the collector-emitter voltage 422 ($U_{CE}$). In the example of FIG. 4, the resistive-capacitive network 452 includes N−1 additional impedances 455, 456 (where N is an integer larger than one). In addition, each of the N−1 impedances 455, 456 has a further capacitive element 474, 478 ($C_2$, $C_N$) and a further resistive element 476, 480 ($R_2$, $R_N$) coupled in parallel with its respective capacitive element 474, 478 ($C_2$, $C_N$). However, this arrangement is not mandatory. For example, a plurality of impedances 455, 456 may have a common capacitive element, which is coupled in parallel to the respective resistive elements. Conversely, a plurality of impedances 455, 456 may have a common resistive element, which is coupled in parallel with the respective capacitive elements.

In one example, the values of the capacitive elements 474, 478 ($C_2$, $C_N$) of the impedances 455, 456, which are coupled between the second node A 468 and the first node of the resistive-capacitive network, are substantially the same (for example, between 0.5 pF and 200 pF). In addition, the values of the resistive elements 476, 480 ($R_2$, $R_N$) of the impedances 455, 456, which are coupled between the second node A 468 and the first node of the resistive-capacitive network, have substantially the same value (for example between 10 kΩ and 1 MΩ). As also discussed in connection with FIG. 3, the impedances 455, 456 and the first impedance 454 form, in the dynamic equivalent circuit, a resistive-capacitive voltage divider for dividing a dynamic portion of the input signal 322 ($U_{CE}$).

Additionally or alternatively, the value of the first capacitive element 470 ($C_1$) of the first impedance 454 may be selected to compensate or over-compensate (or slightly under-compensate) for the parasitic capacitances of the device for the detection of a change of a voltage across a power semiconductor switch 442. In general, increasing the value of one of the additional capacitive elements 474, 478 ($C_2$, $C_N$) shifts the behavior in the direction of over-compensation. Likewise, decreasing the value of the first capacitive element 470 ($C_1$) shifts the behavior in the direction of over-compensation. On the other hand, decreasing the value of one of the additional capacitive elements 474, 478 ($C_2$, $C_N$) shifts the behavior in the direction of under-compensation. Likewise, increasing the value of the first capacitive element 470 ($C_1$) shifts the behavior in the direction of under-compensation. Thus, the value of one or more of the additional capacitive elements 474, 478 ($C_2$, $C_N$) can be higher than in a compensated case to achieve over-compensation. Alternatively, the value of one or more of the additional capacitive elements 474, 478 ($C_2$, $C_N$) can be lower than in an exactly compensated case to achieve under-compensation.

For instance, the value of the first capacitive element 470 ($C_1$) can be in the range of a few Pico farads to a few tens of Pico farads (for example, 3 pF to 20 pF) below the value of the additional capacitive elements 474, 478 ($C_2$, $C_N$) of the additional impedances 455, 456 to compensate for the parasitic capacitances. Alternatively, the value of the first capacitive element 470 ($C_1$) can be lower than in the compensated case to over-compensate the parasitic capacitances (or it can be higher to under-compensate the parasitic capacitances up to a certain degree). In one example, the value of the additional capacitive elements 474, 478 ($C_2$, $C_N$) can be up to 20 pF higher than a value for the exactly compensated case to over-compensate the parasitic capacitances.

In addition, each capacitive element of the resistive-capacitive voltage divider 452 has a value corresponding to at least eight times the value of the parasitic capacitances of the device for detecting a change of a voltage across a power semiconductor switch 442.

In the device for the detection of a change of a voltage across a semiconductor power switch 442 shown in FIG. 4, first and second clamping circuits 458, 460 can be provided which function similar to the corresponding first and second clamping circuits 358, 360 in FIG. 3. In one example, the first and second clamping circuits 458, 460 may each include a diode.

An optional resistive element 471 ($R_E$) may be coupled in parallel to the first capacitive element 470. The optional resistive element 471 ($R_E$) can be designed to determine a stationary/constant value of the detection signal 446 (at least partially). It can have a value between 1 MΩ and 20 MΩ. If the voltage level of the collector-emitter voltage ($U_{CE}$) is approximately stationary/constant sometime after a switching event, then the voltage at second node A 468 is at least partially determined through the resistive elements of the resistive-capacitive voltage divider 452. Then, the optional resistive element 471 ($R_E$) can be utilized to determine, at least partially, the voltage level at second node A. The voltage level at node A influences to what voltage level of a capacitance of the timer circuit 462 (see below) is charged or discharged to in both a normal situation and in a short circuit or overcurrent situation and thus the stationary voltage level of the detection signal 446. The optional resistive element 471 ($R_E$) thus can be selected to partially adjust the stationary/constant value of the detection signal 446. Without the optional resistive element 471 ($R_E$) the stationary level of the voltage at the second node A is the level of the input signal 422 ($U_{CE}$) if the first or second clamping circuits 458, 460 do not conduct.

As has already been described, the resistive-capacitive network 452 compensates for the parasitic capacitances of the device for the detection of a change of a voltage across a power semiconductor switch 442 (or over-compensates the parasitic capacitances). Various components can contribute to the parasitic capacitances depending on the specific design of the device 442. For example, PCB layout capacitances may contribute to the parasitic capacitance of the device for the detection of a change of a voltage across a power semiconductor switch 442. In addition, capacitances of the diodes of the first and second clamping circuits 458, 460 can also contribute to the parasitic capacitances of the device for the detection of a change of a voltage across a power semiconductor switch 442. In one example, the PCB layout capacitances lie in parallel to the first capacitive element 470 ($C_1$) as parasitic capacitances.

The timer circuit 462 includes an RC element including the capacitance 484 ($C_T$) and a resistive element 482 ($R_T$). The voltage at one end of the capacitance 484 ($C_T$) of the timer circuit 462 may be the detection signal 446 which is representative of a change of the collector-emitter voltage of a power semiconductor switch after a switching on event of the power semiconductor switch. The timer circuit can also be designed in a different manner. For example, a digital circuit can sample a voltage level at the third node of the resistive-capacitive network 452 and generate the detection signal 446 in response to the voltage level at the third node.

If a comparator is used to compare the detection signal 446 with a reference voltage to detect a short-circuit or overcurrent state as in FIG. 2, the capacitance 484 ($C_T$) is maintained at a level below the reference voltage as long as the power semiconductor switch is in an off state. For example, the capacitance 484 ($C_T$) can be held to a voltage level of the control signal 130 in the off state, $V_{OFF}$.

Figure 5:
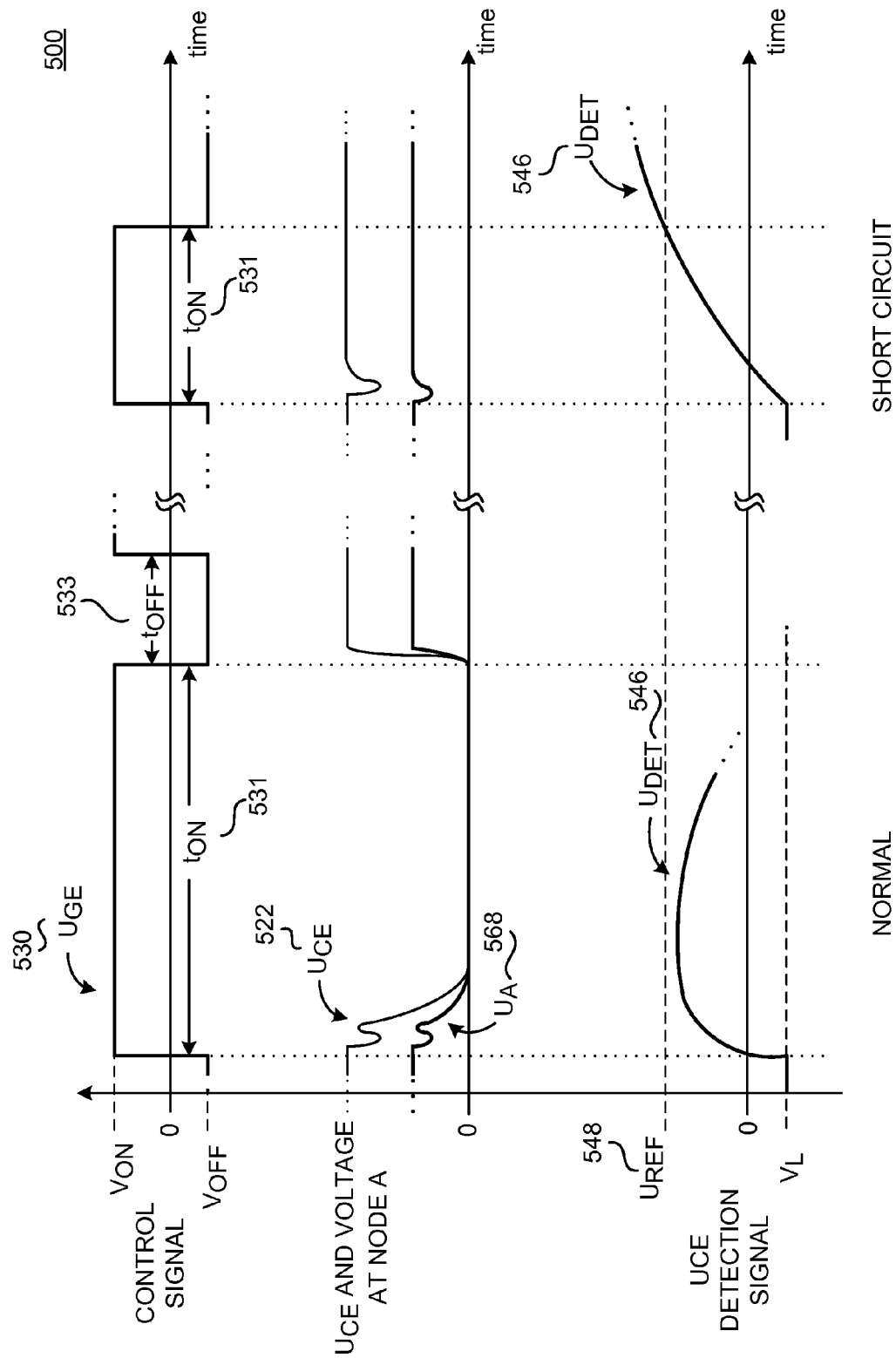
FIG. 5 shows different signals in the device for the detection of the voltage change across a power semiconductor switch from FIG. 4.

In one example, the first end of the capacitor 484 ($C_T$) can be connected to a switch (not shown in FIG. 4). If the power semiconductor switch is switched off, the switch can clamp the first end 484 of the capacitance ($C_T$) to a level below the reference voltage. The capacitance 484 ($C_T$) is then discharged until the level below the reference voltage is reached (not shown in FIG. 5).

After the power semiconductor switch turns on, the capacitance 484 ($C_T$) of the timer circuit 462 is charged so that the voltage level of the detection signal 446, which is representative of a change of the collector-emitter voltage of a power semiconductor switch after switching on the power semiconductor switch, increases. If, as discussed in the last paragraph, a switch is used to clamp the first end of the capacitance 484

($C_T$) to a level below the reference voltage, the switch is opened in response to the turning on the power semiconductor switch. The first end of the capacitance 484 ($C_T$) is hereby released and the voltage level of the detection signal 446 can rise in response to a change of the collector-emitter voltage of the power semiconductor switch.

However, if the collector-emitter voltage 422 ($U_{CE}$) does not fall below a predetermined value after the switching on event of the power semiconductor switch, then the capacitance 484 ($C_T$) of the timer circuit 462 is charged above the predetermined threshold voltage (for example, the voltage level of the reference signal 248 in FIG. 2). This behavior is shown on the right hand side of FIG. 5. The characteristics of the drive signal 530, the collector-emitter voltage 522, voltage at node A 568, and the detection signal 546 are shown under short circuit conditions on the left hand side of FIG. 5. The upper waveform shows an exemplary control signal 530 ($U_{GE}$). As shown on the right hand side of the middle waveform, the collector-emitter voltage 522 ($U_{CE}$) of the power semiconductor switch only falls slightly in the case of a short circuit, and then returns to a relatively high level. In other short-current situations the collector-emitter voltage may initially drop to its normal mode level and returns to a higher level after some time. As a result, a voltage level at node 568 A ($V_A$) is higher than under normal conditions. As a result, the voltage of one end of the capacitance of the timer circuit (i.e. the detection signal 546) increase above the voltage level of the reference signal 568 ($U_{REF}$). In other words, the capacitance 484 is charged such that the detection signal 546 increases above the predetermined threshold voltage. A short-circuit or an overcurrent protection circuit (for example, circuit 240 in FIG. 2) can detect this rise and can determine there is an error and can output a corresponding error signal. As a result, a control circuit can turn off the power semiconductor switch, and an ON time 531 ($t_{ON}$) is shortened and the power semiconductor switch may not be damaged. The time constant of the rise of the detection signal 546 may be at least partially determined by the values of the capacitance 484 ($C_T$) and the resistive element 482 ($R_T$) of the timer circuit 462. The capacitance 484 ($C_T$) can also be charged above the voltage level of the reference signal 548 ($U_{REF}$) if a short-circuit or overcurrent situation occurs after the collector-emitter voltage of the power semiconductor switch has dropped to its stationary/constant level in an on state.

However, if the collector-emitter voltage 422 ($U_{CE}$) falls below the predetermined value after turning on the power semiconductor switch, the device 442 prevents the voltage of the capacitance 484 ($C_T$) of the timer circuit 462 from increasing above the predetermined threshold voltage (for example, the voltage level of the reference signal 248 in FIG. 2). In other words, the device 442 prevents the capacitance 484 from being charged such that the detection signal 546 does not increase above the predetermined threshold voltage. This behavior is again illustrated by FIG. 5. The waveform characteristics of the drive signal 530, the collector voltage 522, voltage at node A 568, and the detection signal 546 are shown under normal conditions on the left hand side of FIG. 5. An exemplary control signal 530 ($U_{DR}$) of a power semiconductor switch is again outlined right at the top. The length of ON time 531 ($t_{ON}$) and the length of OFF time 533 ($t_{OFF}$) can be controlled by a system control (for example, system control 214 in FIG. 2) in accordance with the requirements of the power converter. The control circuit 218 can additionally turn off the power semiconductor switch in response to different errors (e.g., in response to error signal 250 ($U_{FT}$) in FIG. 2). As shown in the middle curve on the left, the collector-emitter voltage 522 ($U_{CE}$) of the power semiconductor switch falls significantly in the normal condition (to a level close to 0 V). At the same time, the voltage level falls at the second node A 568 ($U_A$). As a result, the capacitance of the timer circuit is initially charged, so that the voltage level of the detection signal 546 increases. However, if the collector-emitter voltage 522 ($U_{CE}$) of the power semiconductor switch (and hence the voltage at node A 568) falls below a predetermined value, the capacitance of the timer circuit is not further charged. On the contrary, the device 442 for the detection of a change of a voltage over the power semiconductor switch may discharge the capacitance 484 of the timer circuit 462. Thus the voltage level of the detection signal 546 remains below a reference voltage 546 and the short-circuit or overcurrent detection circuit is not triggered.

By employing the first clamping circuit 458, a timing detection of a short-circuit or overcurrent state can be largely independent of the amplitude of the collector-emitter voltage ($U_{CE}$) of the power semiconductor switch in the switched off state. For example, the detection timing can be about 4 to 20 microseconds after a switching event, regardless of the value of the collector-emitter voltage ($U_{CE}$) of the power semiconductor switch (e.g., 1.2 kV in a first mode of operation and 4.5 kV in a second mode of operation). As described above, the first clamping circuit 458 can clamp the voltage level at the third node of the resistive capacitive network 462 to a first reference potential 464 ($V_H$), as long as the voltage level at the second node A is above the first reference potential 464 ($V_H$) and optional voltage drops over components of the first clamping circuit 458. If a resistive element 471 ($R_E$) is coupled in parallel to the first capacitive element 470, as in the device for detecting a change in the voltage across a power semiconductor switch 442, the first clamping circuit 458 clamps the voltage at the third node as long as the divided input signal 422 ($U_{CE}$) has a higher level than the first reference potential 464 ($V_H$) and optional voltage drops of the first clamping circuit's components. This is independent of the respective collector emitter voltage ($U_{CE}$) of the power semiconductor switch in the off state. In addition, the capacitance is 484 ($C_T$) of the timer circuit 462 can be charged at the same rate independently of the respective value of the collector-emitter voltage ($U_{CE}$) of the power semiconductor switch.

In the previous examples it has been discussed how a resistive-capacitive network can compensate the parasitic capacitances of the device for the detection of the change in the collector-emitter voltage or drain-source voltage of a power semiconductor switch in order to avoid erroneous detections of a short-circuit or overcurrent state. However, the capacitive elements of the resistive-capacitive network need not necessarily be additional components. In one example, one or more of the capacitive elements of the resistive-capacitive network can be formed by the parasitic capacitances of the device for the detection of the change in the collector-emitter voltage or drain-source voltage of a power semiconductor switch themselves. For instance, PCB layout capabilities of the device for the detection of the change in the collector-emitter voltage or drain-source voltage of a power semiconductor switch may be used as elements of a resistive-capacitive network. The arrangement of the components of the device for the detection of the change in the collector-emitter voltage or drain-source voltage of a power semiconductor switch may be chosen such that PCB layout capabilities have suitable values to act so as one or more of the capacitive elements of the resistive-capacitive network.

Figure 6:
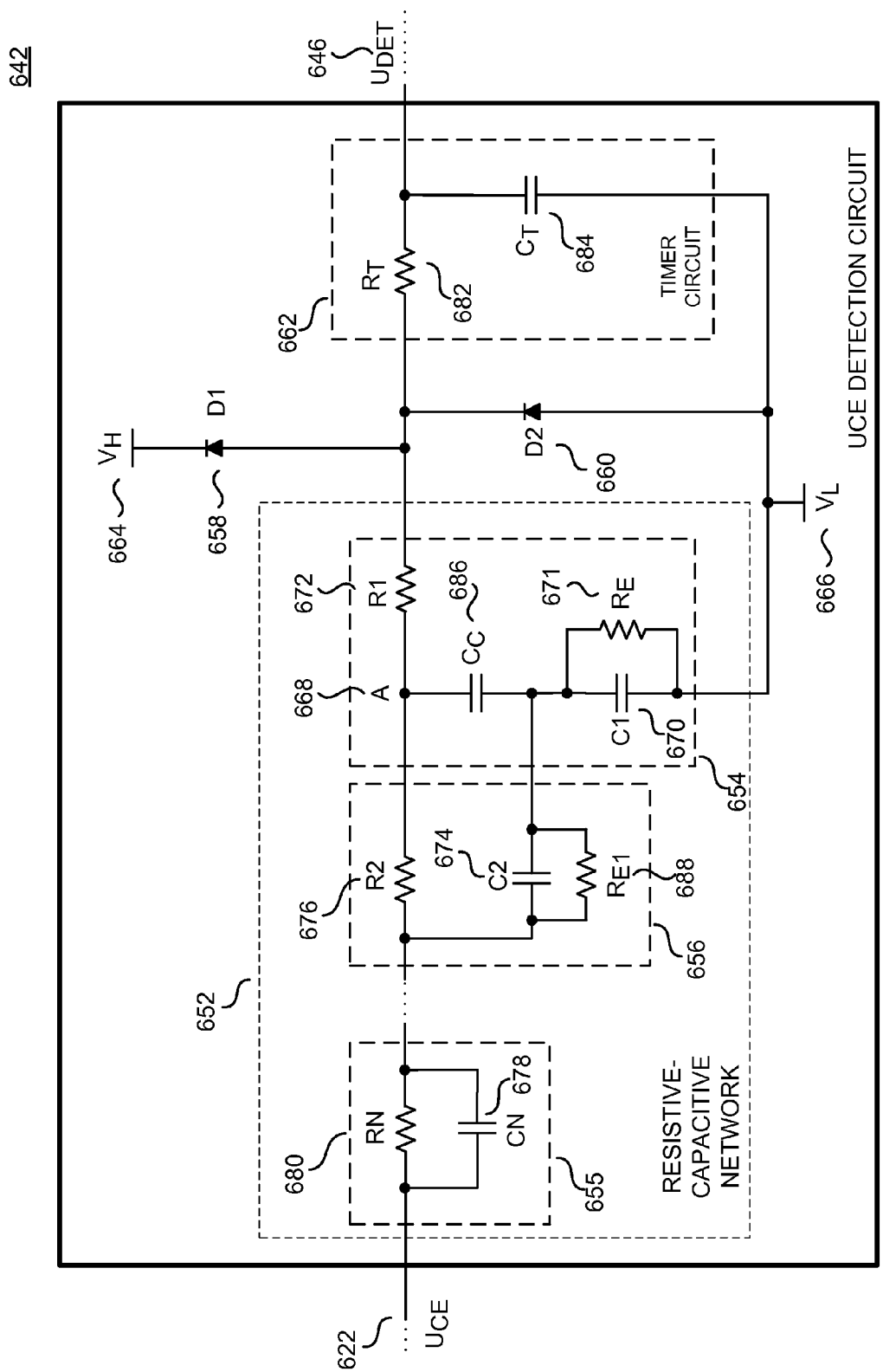
FIG. 6 shows another exemplary device for the detection of to voltage change across a power semiconductor switch.

The device for the detection of a change of a voltage across a semiconductor power switch 642 according to FIG. 6 includes the components of the device for the detection of a change of a voltage across a power semiconductor switch 442 according to FIG. 4. In addition, the device 642 according to FIG. 6 has a further capacitive element 686 ($C_C$), which is coupled between node A 668 and a first end of the first capacitive element 670. The value of the additional capacitive element 686 ($C_C$) may be significantly smaller (one fifth or less, or one-tenth or less) than the value of the capacitive element 670 ($C_1$). In this case, the capacitance between the second node A 668 and the fourth node (which is at the first reference voltage 666 ($V_L$)) is nearly equal to the value of the additional capacitive element 686 ($C_C$)

$$\left(\text{approximately equal to } \frac{1}{1/C_c + 1/C_1}\right).$$

In addition, the additional capacitive element 686 ($C_C$) may be significantly smaller (one fifth or less, or one-tenth or less) than the capacitance 684 ($C_T$) of the timer circuit 662. In this way, the influence of the capacitive element 670 ($C_1$) on a voltage level at the second node A can be reduced by the additional capacitive element 686 ($C_C$), if the signal which is representative for a voltage over a power semiconductor switch is below the reference voltage level. This can affect the charging time of the capacitance 684 ($C_T$) of the timer circuit 662 and thus the period of time until a short circuit or overcurrent state is detected is less strongly influenced by the collector-emitter voltage ($U_{CE}$) of the power semiconductor switch in an OFF-state. The additional capacitive element 686 ($C_C$) may also reduce variation in the period of time until a short circuit or overcurrent state is detected, especially in the range of relatively low collector voltages ($U_{CE}$) of a power semiconductor switch in the OFF state (for example, 200 to 400 V).

Additionally or alternatively, more capacitive elements may also be included in the other impedances 656, 655 of the resistive-capacitive network 652. Thus, a second additional capacitive element (not shown in FIG. 6) can be inserted in a second impedance and coupled in parallel to the second resistive element 676 ($R_2$) and in series to a second capacitive element 674 ($C_2$) of the second impedance. In addition, the end of the second additional capacitive element which is coupled to the second capacitive element 674 ($C_2$) is also coupled to the capacitance of the impedance adjacent to the impedance 656. In the example of FIG. 6, if there are no intervening impedances between the impedance 655 and 656, the second additional capacitive element may at one end be coupled to resistive elements 676 and 680 ($R_2$ and $R_N$) and at the other end be coupled to capacitances 674 and 678 ($C_2$ and $C_N$). This second additional capacitive element may be dimensioned to be significantly smaller (one fifth or less, or one-tenth or less) than the second capacitive element 674 ($C_2$) of the second impedance (656). Thus, it functions in relation to the second capacitive element 674 ($C_2$) of the second impedance 656 in a manner similar to the first additional capacitive element 686 ($C_C$) in relation to the capacitive element 670 ($C_1$) of the first impedance (670). The second additional capacitive element essentially determines the capacitance of the device and reduces the influence of the second capacitive element 674 ($C_2$) on the charging time of the capacitance 684 ($C_T$) of the timer circuit 662.

Additionally and independently of the additional capacitive elements, the device for the detection of a change of a collector-emitter voltage of a semiconductor power switch 642 according to FIG. 6 has a further resistive element 688 ($R_{E1}$), which coupled in parallel with the second capacitive element 674 ($C_2$) of the second impedance 674. This can help to determine a stationary/constant voltage level of the detection signal 646 (together with the optional first resistive element 671 ($R_E$) which is coupled in parallel with the first capacitive element 670 ($C_1$)). The additional optional resistive elements 688 ($R_{E1}$) and 671 ($R_E$) can also contribute to determining the stationary/constant voltage level at the node between the further capacitive elements 686 ($C_C$), and the optional resistive elements 688 ($R_{E1}$) and 671 ($R_E$). This can prevent stationary overvoltage across the capacitive elements 670, 674 ($C_1$, $C_2$) and the further capacitive element 686 ($C_C$). For instance, an isolation resistance of the capacitive elements 670, 674 ($C_1$, $C_2$) and the further capacitive element 686 ($C_C$) can be different even for two components having the same specification. As a consequence, a voltage drop over these components in a stationary state can also vary from circuit to circuit. This, in turn, can result in a voltage over the capacitive elements 670, 674 (C1, C2) or the further capacitive element 686 (CC) exceeding an admissible voltage level. In addition, the isolation resistance of the capacitive elements 670, 674 (C1, C2) and the further capacitive element 686 (CC) can change over time, which also can lead to excess voltages over these components. Alternative to the optional resistive elements 688 ($R_{E1}$) and 671 ($R_E$) the device for the detection of a change in the voltage across a power semiconductor switch 642 may include a resistive element being coupled in parallel to the further capacitive element 686 ($C_C$). This resistive element can be at least five to ten times as large as the first resistive element 62 ($R_1$).

Figure 7:
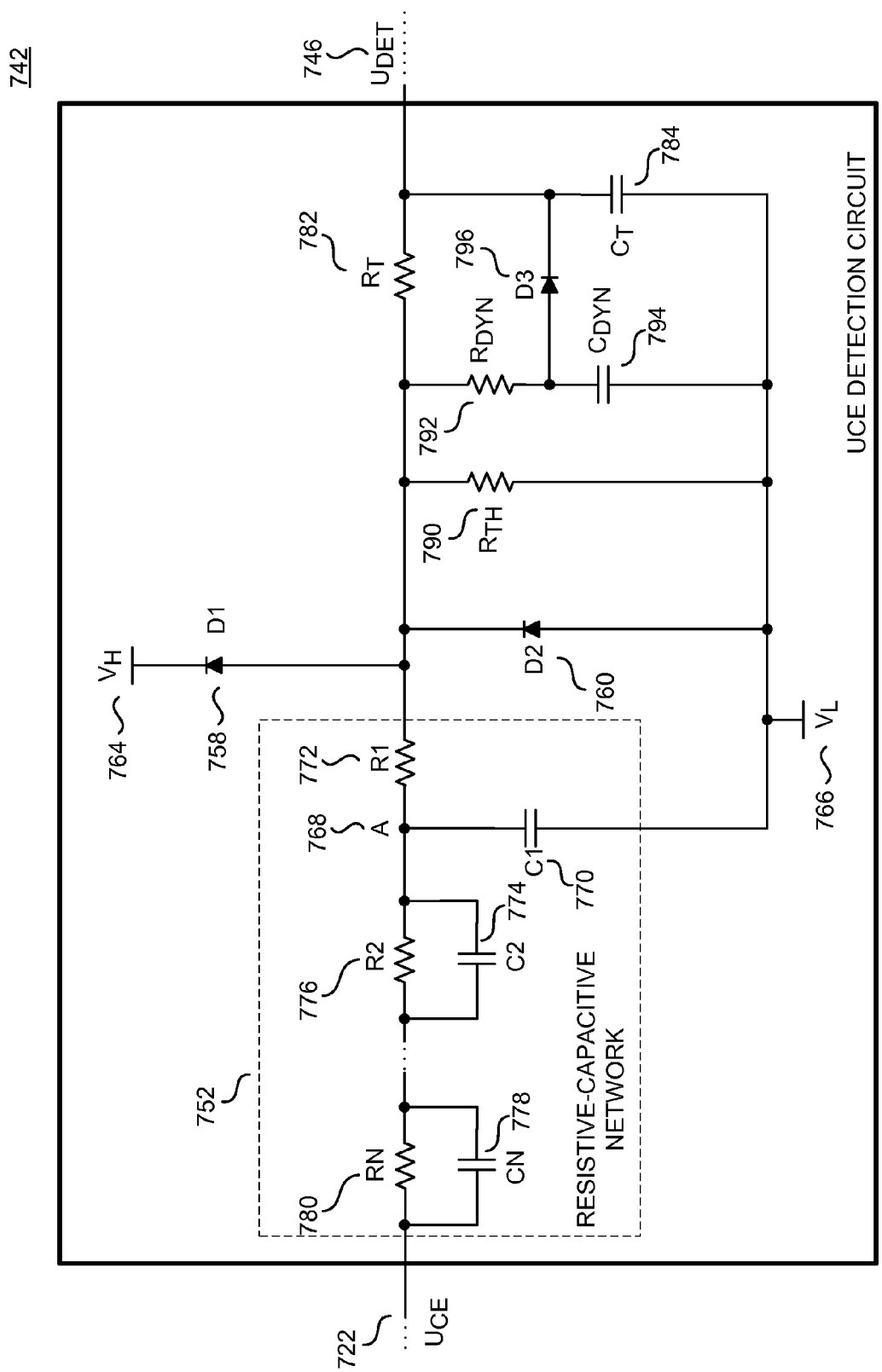
FIG. 7 shows another exemplary device for the detection of the voltage change across a power semiconductor switch.

The device for the detection of a change of a voltage across a power semiconductor switch 742 according to FIG. 7 includes the components of the device for the detection of a change of a voltage across a power semiconductor switch 442 according to FIG. 4 apart from the optional resistive element ($R_E$). In addition, the circuit according to FIG. 7 includes an additional resistive element 790 ($R_{th}$), which is coupled between the input of the timer circuit and a lower reference voltage 766 ($V_L$). Similar to the optional first resistive member ($R_E$) in the devices of FIG. 4 or FIG. 6, the additional resistive element 790 ($R_{th}$) may also determine the stationary/constant value of the detection signal 446 (at least partially). If the voltage level of the collector-emitter voltage ($U_{CE}$) is approximately stationary/constant sometime after a switching event, then the voltage at node A 768 is at least partially determined through the resistive elements of the resistive-capacitive voltage divider 752. Then, the optional additional resistive element 790 ($R_{th}$) can be utilized to determine, at least partially, the voltage level at node A. The voltage level at node A influences to what voltage level a capacitance of the timer circuit 762 (see above) is charged or discharged to in a normal situation and in a short circuit or overcurrent situation and thus the stationary voltage level of the detection signal 746. The optional additional resistive element 790 ($R_{th}$) thus can be selected to partially adjust the stationary/constant value of the detection signal 746.

The timer circuit of FIG. 7 further includes second reference resistor 792 ($R_{DYN}$), a second capacitance 794 ($C_{DYN}$), and a diode D3 796 which are designed to influence a dynamic level of the detection signal 746. This can be used to switch on high-voltage IGBTs without massively increasing a detection threshold of a short-circuit or overvoltage detection circuit. Some high-voltage IGBTs require several tens of µs to reach a steady-state voltage in an ON-state.

The above description of the illustrated examples of the present invention is not meant to be exhaustive or limited to the examples. While specific embodiments and examples of the invention are described herein for illustrative purposes, various modifications are possible without departing from the present invention. The specific examples of voltage, current, frequency, power, range values, times, etc., are only illustrative, so that the present invention can also be implemented with other values for these magnitudes.

These modifications can be carried out on examples of the invention in the light of the above detailed description. The terms used in the following claims should not be so construed that the invention is limited to the specific embodiments disclosed in the specification and the claims. The present specification and figures are illustrative and should not be regarded as limiting.

What is claimed is:

1. A device for the detection of a change in the voltage across a power semiconductor switch, the device comprising:
    a resistive-capacitive network having a first, a second, a third and a fourth node, wherein the resistive-capacitive network is to be coupled to a first terminal of the power semiconductor switch at the first node and to provide at the second node a signal that is representative of a voltage across the power semiconductor switch, wherein the resistive-capacitive network includes:
        at least one impedance coupled between the first and second nodes;
        a first resistive element coupled between the second and third nodes; and
        a first capacitive element coupled between the second and fourth nodes; and
    a timer circuit coupled to the third node of the resistive-capacitive network and configured to generate a detection signal that is representative of the change in the voltage across the power semiconductor switch after switching on of the power semiconductor switch, wherein the timer circuit is configured to raise a level of the detection signal above a predetermined threshold voltage if the voltage across the power semiconductor switch does not fall below a predetermined value after switching on of the power semiconductor switch, and wherein the resistive-capacitive network is configured such that parasitic capacitances of the device are compensated or over compensated so as to prevent the timer circuit from raising the level of the detection signal above the predetermined threshold voltage if the voltage across the power semiconductor switch does fall below the predetermined value after switching on of the power semiconductor switch.

2. The device as per claim 1, further comprising a clamping circuit configured to limit a voltage at the third node of the resistive-capacitive network to a maximum predetermined voltage.

3. The device as per claim 2, wherein the maximum predetermined voltage corresponds to an ON-level of a gate-emitter driving signal of the power semiconductor switch.

4. The device as per claim 1, wherein the fourth node is at a second reference potential.

5. The device as per claim 1, wherein the at least one impedance compensates or overcompensates the parasitic capacities of the device.

6. The device as per claim 1, wherein the at least one impedance comprises a capacitive element and a parallel resistive element.

7. The device as per claim 1, wherein the resistive-capacitive network includes one or more further impedances in series with the at least one impedance between the first node and the second node of the resistive-capacitive network, each of which has a capacitive element and a parallel resistive element.

8. The device as per claim 7, wherein the resistive-capacitive network includes a first further resistive element that is coupled parallel to the first capacitive element and a second further resistive element which is coupled in parallel to a second capacitive element of the resistive-capacitive network.

9. The device as per claim 8, wherein the first and second further resistive elements are configured to limit a stationary voltage level across the first and second capacitive elements.

10. The device as per claim 1, further comprising a second clamping circuit configured to limit a node between the resistive-capacitive network and the timer circuit to a minimum predetermined voltage.

11. The device as per claim 10, wherein the minimum predetermined voltage corresponds to an OFF-level of a gate-emitter driving signal of the power semiconductor switch.

12. The device as per claim 1, wherein the timer circuit includes a capacitance which is charged or discharged in response to a voltage level at the third node of the resistive-capacitive network and a resistive element, wherein a voltage level at one end of the capacitance is the detection signal.

13. The device as per claim 1, wherein the timer circuit includes a digital circuit which is configured to sample a voltage level at the third node of the resistive-capacitive network and to generate the detection signal in response to the voltage level at the third node.

14. The device as per claim 1, wherein the timer circuit has no active component.

15. The device as per claim 1, wherein the resistive-capacitive network has a further capacitive element that is coupled between the second node and the first capacitive element, wherein the at least one impedance includes a capacitive element and a resistive element coupled in parallel to the capacitive element and wherein the resistive element is coupled to the second node and the capacitive element of the at least one impedance is coupled to the first capacitive element.

16. The device as per claim 15, wherein the capacitive element of the first impedance is at least five times greater than the further capacitive element.

17. The device as per claim 15, wherein the further capacitive element is arranged such that an influence of the first capacitive element on a voltage level at the second node is reduced.

18. The device as per claim 15, wherein the further capacitive element is designed to reduce an amount of electrical charge that oscillates between the first capacitive element and the second node.

19. The device as per claim 1, further comprising a further resistive element that is coupled between the third node and a reference potential and that is configured to partially set a stationary level of the detection signal.

20. The device as per claim 1, wherein the timer circuit further includes a further resistive element, a diode, and a second capacitance which are configured to influence a dynamic level of the detection signal.

21. A device for the detection of a short circuit or excess current situation in a power semiconductor switch, wherein the device comprises:
    a resistive-capacitive network having a first, a second, a third and a fourth node, wherein the resistive-capacitive network is to be coupled to a first terminal of the power semiconductor switch at the first node and to provide at the second node a signal that is representative of a voltage across the power semiconductor switch, wherein the resistive-capacitive network includes:

at least one impedance coupled between the first and second nodes;

a first resistive element coupled between the second and third nodes; and a first capacitive element coupled between the second and fourth nodes;

a timer circuit coupled to the third node of the resistive-capacitive network and configured to generate a detection signal that is representative of the change in the voltage across the power semiconductor switch after switching on of the power semiconductor switch, wherein the timer circuit is configured to raise a level of the detection signal above a predetermined threshold voltage if the voltage across the power semiconductor switch does not fall below a predetermined value after switching on of the power semiconductor switch, and wherein the resistive-capacitive network is configured such that parasitic capacitances of the device are compensated or over compensated so as to prevent the timer circuit from raising the level of the detection signal above the predetermined threshold voltage if the voltage across the power semiconductor switch does fall below the predetermined value after switching on of the power semiconductor switch; and a comparator coupled to receive the detection signal and to transmit an error signal which indicates if the detection signal exceeds a reference signal.

22. The device as per claim 21, wherein the reference signal is stationary.

23. The device as per claim 21, wherein the timer circuit includes a capacitance which is charged or discharged in response to a voltage level at the third node of the resistive-capacitive network and a resistive element, wherein a voltage level at one end of the capacitance is the detection signal, the device further comprising a switch configured to clamp one end of the capacitance of the timer circuit to a fixed potential if the power semiconductor switch is switched off.

24. The device as per claim 23, wherein the capacitor of the timing circuit is at least partially discharged if the one end of the capacitance of the timer circuit is clamped to a fixed potential if the power semiconductor switch is switched off.

25. A control circuit for a power semiconductor switch, wherein the control circuit comprises:

a device for the detection of a change in the voltage across a power semiconductor switch, wherein the device includes:

a resistive-capacitive network having a first, a second, a third and a fourth node, wherein the resistive-capacitive network is to be coupled to a first terminal of the power semiconductor switch at the first node and to provide at the second node a signal that is representative of a voltage across the power semiconductor switch, wherein the resistive-capacitive network includes:

at least one impedance coupled between the first and second nodes;

a first resistive element coupled between the second and third nodes; and a first capacitive element coupled between the second and fourth nodes;

a timer circuit coupled to the third node of the resistive-capacitive network and configured to generate a detection signal that is representative of the change in the voltage across the power semiconductor switch after switching on of the power semiconductor switch, wherein the timer circuit is configured to raise a level of the detection signal above a predetermined threshold voltage if the voltage across the power semiconductor switch does not fall below a predetermined value after switching on of the power semiconductor switch, and wherein the resistive-capacitive network is configured such that parasitic capacitances of the device are compensated or over compensated so as to prevent the timer circuit from raising a level of the detection signal above the predetermined threshold voltage if the voltage across the power semiconductor switch does fall below the predetermined value after switching on of the power semiconductor switch;

a comparator coupled to receive the detection signal and to transmit an error signal which indicates if the detection signal exceeds a reference signal; and a drive circuit coupled to receive the error signal and to switch off the power semiconductor switch in response to the error signal indicating that the detection signal exceeds the reference signal.

26. The control circuit as per claim 25, further comprising a power semiconductor switch coupled to be controlled by the drive circuit.

27. The control circuit as per claim 25, wherein the voltage across the power semiconductor switch corresponds to a collector-emitter, an anode-cathode voltage, or a drain-source peak voltage of the power semiconductor switch.

28. The control circuit as per claim 25, wherein a maximal nominal voltage in a switched-off state of the power semiconductor switch is more than 500 V.

29. The control circuit as per claim 25, wherein a maximal nominal voltage in a switched-off state of the power semiconductor switch is more than 2 kV.

* * * * *